US011246246B2

(12) United States Patent
Ohkubo et al.

(10) Patent No.: US 11,246,246 B2
(45) Date of Patent: Feb. 8, 2022

(54) ELECTRONIC CONTROL DEVICE

(71) Applicant: Hitachi Automotive Systems, Ltd., Hitachinaka (JP)

(72) Inventors: Yoko Ohkubo, Hitachinaka (JP); Masahiro Toyama, Tokyo (JP); Hideyuki Sakamoto, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 16/980,534

(22) PCT Filed: Feb. 14, 2019

(86) PCT No.: PCT/JP2019/005209
§ 371 (c)(1),
(2) Date: Sep. 14, 2020

(87) PCT Pub. No.: WO2019/181290
PCT Pub. Date: Sep. 26, 2019

(65) Prior Publication Data
US 2021/0015008 A1 Jan. 14, 2021

(30) Foreign Application Priority Data
Mar. 23, 2018 (JP) .............................. JP2018-056744

(51) Int. Cl.
*H05K 9/00* (2006.01)
*H05K 5/04* (2006.01)
(52) U.S. Cl.
CPC ............. *H05K 9/0026* (2013.01); *H05K 5/04* (2013.01); *H05K 9/0037* (2013.01)
(58) Field of Classification Search
CPC ............................... H05K 9/0037; H05K 5/04
See application file for complete search history.

(56) References Cited

U.S. PATENT DOCUMENTS 5,414,597 A * 5/1995 Lindland .............. H05K 9/0037
174/361
6,608,251 B1 * 8/2003 Nurmi .................. H05K 9/0016
174/367
(Continued)

FOREIGN PATENT DOCUMENTS

JP       S55-22183 U    2/1980
JP       H5-11501 U     2/1993
(Continued)

OTHER PUBLICATIONS

International Search Report with English translation and Written Opinion issued in corresponding application No. PCT/JP2019/005209 dated May 21, 2019.

*Primary Examiner* — Hung V Ngo
(74) *Attorney, Agent, or Firm* — Foley & Lardner LLP

(57) ABSTRACT

To provide an electronic control device capable of suppressing leakage of radio-frequency radiation noise, radiated from a noise source, to the outside.
The electronic control device includes a radio-frequency circuit 104 at least a part of which is driven at a radio frequency, a printed circuit board 101 on which a low-frequency circuit 103 that is driven at a low frequency is mounted, a housing 100 made of metal that includes therein the printed circuit board 101 together with the radio-frequency circuit 104 and the low-frequency circuit 103, a plurality of radio-frequency connectors 106a to 106f for transmitting and receiving signals related to the radio-frequency circuit 104 mounted on the printed circuit board 101 to and from the outside of the housing, a low-frequency connector 105 for transmitting and receiving signals related to the low-frequency circuit 103 mounted on the printed circuit board 101 to and from the outside of the housing, and a partition wall 203 for suppressing propagation of radiation
(Continued)

noise, radiated by driving the radio-frequency circuit 104, to the low-frequency connector 105.

10 Claims, 4 Drawing Sheets

(56) References Cited

U.S. PATENT DOCUMENTS

| | | | | |
|---|---|---|---|---|
| 10,779,395 | B1* | 9/2020 | Harrigan | H03H 7/38 |
| 2002/0118521 | A1* | 8/2002 | Kooker | H05K 9/0037 |
| | | | | 361/753 |
| 2003/0013478 | A1* | 1/2003 | Kuchiishi | H04B 1/3838 |
| | | | | 455/550.1 |
| 2004/0121811 | A1* | 6/2004 | Nakatsuji | H05K 9/0037 |
| | | | | 455/562.1 |
| 2005/0224246 | A1* | 10/2005 | Gottwald | G01S 7/032 |
| | | | | 174/359 |
| 2012/0008288 | A1* | 1/2012 | Tsukamoto | H01L 24/97 |
| | | | | 361/736 |
| 2015/0048675 | A1* | 2/2015 | Fujii | B60L 1/02 |
| | | | | 307/10.1 |
| 2018/0123300 | A1 | 5/2018 | Hansen | |
| 2018/0288909 | A1* | 10/2018 | Wasniewski | H05K 9/0015 |
| 2019/0289758 | A1* | 9/2019 | Furuya | H05K 9/0037 |
| 2019/0364703 | A1 | 11/2019 | Nozawa | |
| 2019/0378802 | A1* | 12/2019 | Ito | H05K 9/0037 |
| 2021/0022277 | A1* | 1/2021 | Embleton | H05K 9/0062 |

FOREIGN PATENT DOCUMENTS

| | | |
|---|---|---|
| JP | H9-283962 A | 10/1997 |
| JP | 2000-269678 A | 9/2000 |
| JP | 2001-223482 A | 8/2001 |
| JP | 2010-245232 A | 10/2010 |
| JP | 2014-024422 A | 2/2014 |
| WO | WO-2016/162212 A1 | 10/2016 |
| WO | WO-2017/159531 A1 | 9/2017 |

* cited by examiner

306 : 306a, 306b

406 : 406a TO 406d
408 : 408a TO 408d
409 : 409a TO 409d

ELECTRONIC CONTROL DEVICE

TECHNICAL FIELD

The present invention relates to an electronic control device.

BACKGROUND ART

An electronic control device to be used in an automobile or the like includes therein a printed circuit board on which a semiconductor device and the like are mounted. The electronic control device has high calculation performance that is required to realize a driving support system such as a collision damage reduction brake and automatic driving. Therefore, it is necessary to mount a semiconductor device of a high operating frequency on an electronic control device of an automobile. Further, it is also necessary to mount a semiconductor device of a low operating frequency to support a conventional communication system such as controller area network (CAN) communication.

On the other hand, a semiconductor device generates unnecessary radiation noise due to its operating current, and it is necessary to suppress influence of such radiation noise on other devices. The allowable level of such radiation noise is standardized by the Comite International Special des Perturbations Radioelectriques (CISPR) that is a special committee of the International Electrotechnical Commission (IEC), which defines, for example, frequencies of radiation noise from component modules mounted on automobiles up to 960 MHz.

As a technique relating to suppression of radiation noise, for example, PTL 1 discloses a radio-frequency shield case made of metal and formed into a housing shape having an outer wall provided with a through-hole, and the inside of the housing is divided by a partition provided with a through-hole. On the circumferential surface of the through hole of the partition, a plurality of recessed grooves are formed along the circumferential surface at predetermined intervals in a state of intersecting with the through direction of the through hole. Further, a plurality of protrusions are provided between the recessed grooves and on both sides thereof to protrude in opposition to each other.

CITATION LIST

Patent Literature

PTL 1: JP 2010-245232 A

SUMMARY OF INVENTION

Technical Problem

Meanwhile, in an electronic control device of an automobile, it is necessary to mount a semiconductor device (radio-frequency circuit) of a high operating frequency due to an increase in the required calculation performance.

Therefore, it is necessary to dispose a radio-frequency circuit and a semiconductor device of a low operating frequency (low-frequency circuit) on one board. Along with this, it is necessary to provide the electronic control device with a low-frequency connector and a radio-frequency connector for connecting to an external device. However, a low-frequency connector is larger in size than a radio-frequency connector because it is used for inputting not only communication signals such as CAN but also power and ground, and is often made of resin. Therefore, there is concern about leakage of radiation noise from the radio-frequency circuit to the outside of the electronic control device through the low-frequency connector.

The present invention has been made in view of the above circumstances, and an object of the present invention is to provide an electronic control device capable of suppressing leakage of radio-frequency radiation noise radiated from a noise source to the outside.

Solution to Problem

The present application includes a plurality of means for solving the above problems. An example thereof includes a board on which a radio-frequency electronic component that operates at a predetermined frequency or higher is mounted, a housing made of metal that internally includes the board, a high-speed communication connector mounted on the board and used for connecting to the outside, and a low-speed communication connector mounted on the board and used for connecting to the outside and having a communication speed lower than the communication speed of the high-speed communication connector. The housing includes a partition wall provided between the radio-frequency electronic component and the low-speed communication connector.

Advantageous Effects of Invention

According to the present invention, leakage of radio-frequency radiation noise, radiated from a noise source, to the outside can be suppressed.

DESCRIPTION OF EMBODIMENTS

Hereinafter, embodiments of the present invention will be described with reference to the drawings. Note that in the below description, an electronic control device used in an automobile or the like (a so-called vehicle-mounted electronic control device) is described as an example. However, the present invention is applicable to an electronic control device other than a vehicle-mounted electronic control device. Further, in the below description, when there are a plurality of the same components, an alphabet may be attached to the end of a reference sign (numeral), but the alphabet may be omitted and those components may be collectively expressed. That is, for example, when the same six radio-frequency connectors 106a to 106f are present, they may be collectively referred to as a radio-frequency connector 106.

<First Embodiment> A first embodiment of the present invention will be described with reference to FIGS. 1 to 3.

Figure 1:
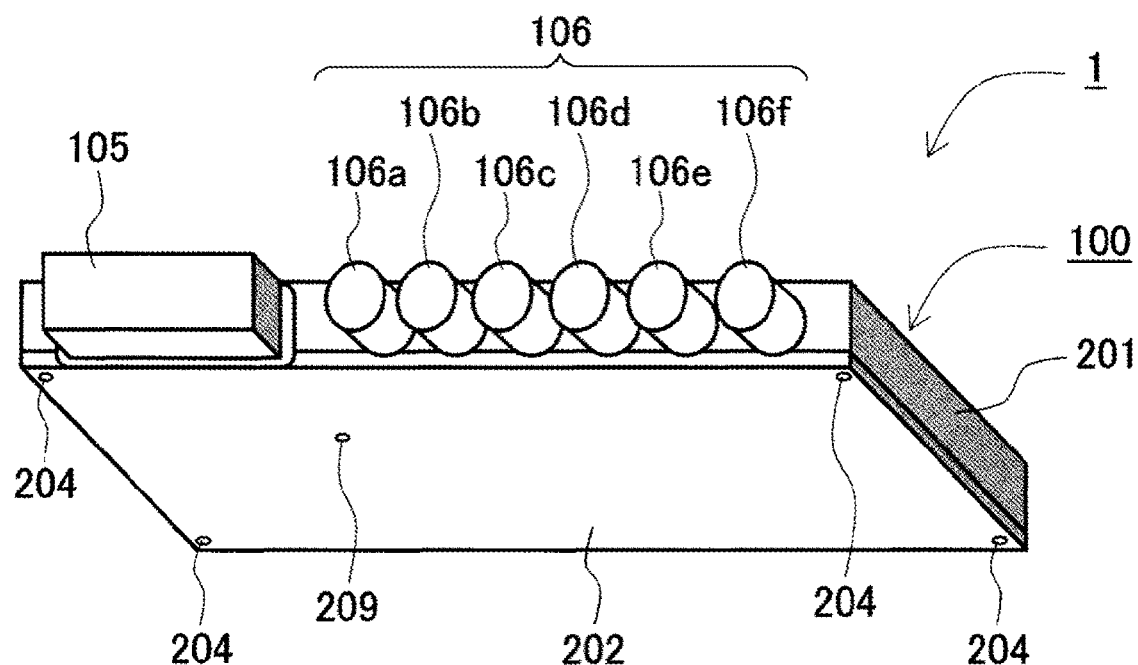
FIG. 1 is a perspective view schematically showing the outer appearance of an electronic control device according to a first embodiment.
Figure 2:
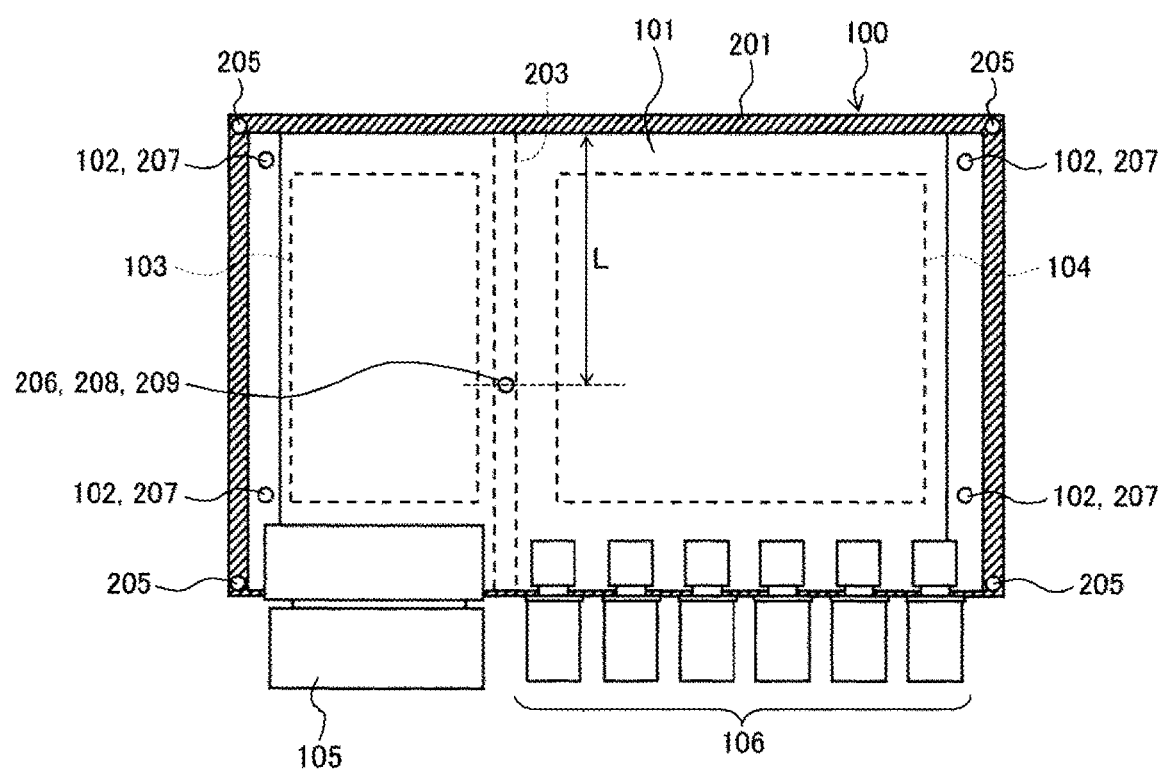
FIG. 2 is an exploded view of the electronic control device according to the first embodiment.
Figure 3:
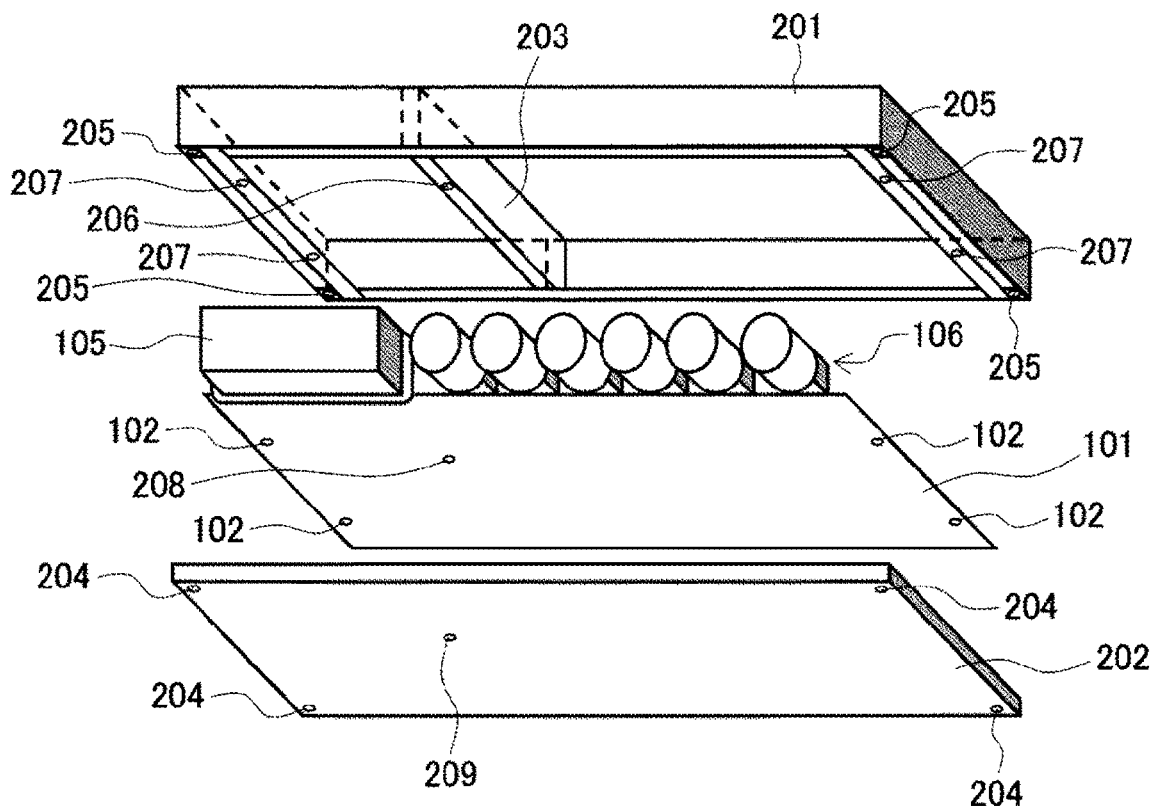
FIG. 3 is a cross-sectional view taken along a plane along an upper surface of a board of the electronic control device according to the first embodiment.

FIG. 1 is a perspective view schematically showing the outer appearance of an electronic control device according to the present embodiment, FIG. 2 is an exploded view, and FIG. 3 is a cross-sectional view on a plane along an upper surface of a board.

As shown in FIGS. 1 to 3, an electronic control device 1 includes a printed circuit board 101 on which electronic components are mounted, a housing 100 made of metal that includes therein the printed circuit board 101, and connectors 105 and 106 mounted on the printed circuit board 101 and used for performing communication with the outside. As shown in FIG. 2, on the printed circuit board 101, a radio-frequency circuit 104 (radio-frequency electronic components) driven at a radio frequency and a low-frequency circuit 103 (low-frequency electronic components) driven at a low frequency are mounted collectively so as to be separated in a radio-frequency region and a low-frequency region. The low-frequency circuit 103 is disposed on the low-frequency connector 105 side, and the radio-frequency circuit 104 is disposed on the radio-frequency connector 106 side. Further, the printed circuit board 101 is provided with a plurality of (for example, six) radio-frequency connectors 106a to 106f for transmitting and receiving signals, related to the radio-frequency circuit 104, to and from the outside of the housing, and the low-frequency connector 105 for transmitting and receiving signals, related to the low-frequency circuit 103, to and from the outside of the housing. The low-frequency connector 105 and the radio-frequency connector 106 are arranged so as to extend through the housing 100 to the outside of the housing 100.

The printed circuit board 101 is formed to have a multi-layer structure including a ground (so-called signal ground) serving as a reference potential for driving in the radio-frequency circuit 104 and the low-frequency circuit 103, and a ground (so-called frame ground) that is provided while being disconnected from the signal ground. On one surface side of the printed circuit board 101 (top surface side), the low-frequency circuit 103 and the radio-frequency circuit 104 are mounted. Further, the low-frequency connector 105 is mounted near the low-frequency circuit 103, and the radio-frequency connector 106 is mounted near the radio-frequency circuit 104. Note that, for convenience of explanation, a surface on the upper side of the printed circuit board 101 in, for example, FIG. 3 is referred to as an upper surface, and a surface on the lower side is referred to as a lower surface.

The low-frequency circuit 103 includes, for example, a control processor, Large Scale Integration (LSI), a Controller Area Network (CAN) transceiver, and a power supply circuit for driving them. The low-frequency circuit 103 is mounted on the upper surface of the printed circuit board 101 by soldering or the like.

The low-frequency connector 105 is used for inputting power supply, ground, and the like, and transmitting and receiving low-speed communication signals such as CAN between the printed circuit board 101 and the outside of the housing 100, and is made of, for example, resin or the like. The low-frequency connector 105 is mounted on the same upper surface as the low-frequency circuit 103 of the printed circuit board 101 and near the low-frequency circuit 103 by soldering or the like.

The radio-frequency circuit 104 includes, for example, a control processor, an LSI, a Field Programmable Gate Array (FPGA), a memory, an Ethernet (registered trademark) transceiver, and a power supply circuit for driving them. The radio-frequency circuit 104 has, on at least a part thereof, an electronic component driven at an operating frequency of 1 GHz or higher (so-called radio frequency).

The radio-frequency connector 106 is used for transmitting and receiving high-speed communication signals such as the Ethernet (registered trademark) between the printed circuit board 101 and the outside of the housing 100, and is formed as, for example, a metallic coaxial connector. The radio-frequency connector 106 is mounted on the same upper surface as the radio-frequency circuit 104 of the printed circuit board 101 and near the radio-frequency circuit 104 by soldering or the like. The radio-frequency connector 106 is a connector for high-speed communication having a higher communication speed than that of the low-frequency connector 105.

Note that the definition of radio frequency and low frequency may include various settings depending on the circuit configuration of the electronic control device 1. For example, 10 kHz may be previously determined as a reference frequency (first reference frequency), and a drive frequency of 10 kHz or higher (that is, a frequency higher than 1 GHz) may be considered as a radio frequency. Further, a reference frequency (second reference frequency) may be previously determined to be lower than 10 kHz, and a drive frequency lower than this frequency may be defined as a low frequency. Further, it may be considered to define one common reference frequency for radio frequency and low frequency (that is, the first reference frequency and the second reference frequency are the same frequency).

The housing 100 includes a metal base 201 disposed to cover the printed circuit board 101 from one surface side (that is, the upper surface side), and a metal cover 202 disposed to cover the printed circuit board 101 from the other surface side (that is, the lower surface side) together with the metal base 201.

The metal base 201 has, for example, a rectangular parallelepiped-like outer shape having a space for accommodating the printed circuit board 101 on the lower surface side. At the four corners on the lower surface side thereof, a plurality of fixing holes (screw holes) 205 for fixing the metal covers 202 with metal screws are provided. The metal cover 202 has, for example, a rectangular outer shape corresponding to the metal base 201, and has a plurality of fixing holes (screw holes) 204 for fixing to the metal base 201 at positions in the four corners thereof corresponding to the fixing holes 205. The metal cover 202 is fixed to the metal base 201 by fixing the fixing holes (screw holes) 204 of the metal cover 202 and the fixing holes 205 of the metal base 201 with metal screws.

Inside the fixing holes 205 on the lower surface of the metal base 201, a plurality of fixing holes (screw holes) 207 for fixing the printed circuit board 101 are provided. Further, at positions corresponding to the fixing holes 207 of the printed circuit board 101, a plurality of fixing holes 102 for fixing to the metal base 201 are provided. The printed circuit board 101 is fixed to the metal base 201 by fixing the fixing holes (screw holes) 102 of the printed circuit board and the fixing holes 207 of the metal base 201 with metal screws.

The fixing hole 102 of the printed circuit board 101 is connected to a frame ground inside the printed circuit board 101. That is, the frame ground of the printed circuit board 101 and the metal base 201 are electrically coupled by a metal screw.

In the metal base 201, when assembled as the housing 100, on at least one surface side (here, upper surface side) of the printed circuit board 101, a partition wall 203 is provided to separate the inside of the housing 100 into a space in which the radio-frequency circuit 104 and the radio-frequency connector 106 are disposed (radio-frequency region) and a space in which the low-frequency circuit 103 and the low-frequency connector 105 are disposed (low-frequency region). In FIG. 2, the position corresponding to the partition wall 203 is indicated by broken lines with a reference numeral 203.

In the present embodiment, the partition wall 203 is formed integrally with the metal base 201, but the present invention is not limited to this, and a separately formed one may be combined later. The merit of integrally molding them is that a gap between the partition wall 203 and the metal base 201 can be suppressed, so that the noise attenuation effect can be enhanced and the manufacturing cost can be reduced.

According to the present embodiment, by providing the partition wall 203 between the radio-frequency circuit 104 and the low-frequency connector 105, the radiation noise propagated to the low-frequency circuit 103 side, of the radiation noise radiated to the internal space of the housing 100 by the driving the radio-frequency circuit 104, can be attenuated, and propagation to the low-frequency connector 105 can be suppressed. In other words, the partition wall 203 constitutes a suppression unit that suppresses noise radiated from the radio-frequency circuit 104 to the low-frequency connector 105.

Also, electronic components are mounted on the printed circuit board 101 so as to be divided into a radio frequency region where only the radio-frequency circuit is mounted and a low frequency region where only the low-frequency circuit is mounted, and the partition wall 203 is provided between the low-frequency region and the radio-frequency region. With this configuration, it is possible to suppress noise to the low-frequency connector 105 with an efficient mounting area on the board.

In a state where the printed circuit board 101 is fixed to the metal base 201, a clearance is provided between the partition wall 203 and the printed circuit board 101 so as to prevent the partition wall 203 from being in contact with the printed circuit board 101 and the electronic components mounted on the printed circuit board 101. On the lower side of the partition wall 203, at least one fixing hole (screw hole) 206 is provided.

Between the low-frequency circuit 103 and the radio-frequency circuit 104 of the printed circuit board 101, a fixing hole (screw hole) 208 is provided at a position corresponding to the fixing hole 206 of the partition wall 203. Further, the metal cover 202 is provided with fixing holes (screw holes) 209 at positions corresponding to the fixing holes 206 and 208. By fixing the fixing hole 209 of the metal cover 202 and the fixing hole 206 of the partition wall 203 to each other with a metal screw via the fixing hole 208 of the printed circuit board 101, the metal base 201 and the metal cover 202 and the frame ground of the printed circuit board 101 are DC coupled to have the same potential.

The metal base 201 and the metal cover 202 are DC-coupled by fastening the screw holes 207 and the screw holes 204 with metal screws. The metal screw inserted into the screw hole 207 and the screw hole 204, the metal screw inserted into the screw hole 209 and the screw hole 206, the metal base 201, and the metal cover 202 form an electromagnetic loop surrounding the radio-frequency circuit.

With this configuration, an electromagnetic loop surrounding the radio-frequency circuit can be formed by the metal base 201, the metal cover 202, and the partition wall 203, and the effect of noise attenuation can be further enhanced, which is more preferable.

Here, it is more preferable to form that the relationship between a distance L and a wavelength $\lambda$ satisfies $\lambda/4 > L$. The distance L is a distance of a longest portion in a cross-section taken along a plane along the partition wall 203 (a distance between the fixing hole 208 and the inner surface in the outer circumferential direction of the metal base 201), in a portion where the space in which the radio-frequency circuit 104 is disposed and the space in which the low-frequency circuit 103 is disposed inside the housing 100 communicate with each other (a clearance between the partition wall 203 and the printed circuit board 101). The wavelength $\lambda$ is a wavelength of radiation noise generated by driving the radio-frequency circuit 104.

In this way, by setting the distance L that is desired to be suppressed (desired to be attenuated) to be shorter than ¼ of the wavelength of the frequency of the radiation noise, the radiation noise radiated by the driving of the radio-frequency circuit 104 (so-called radio frequency noise) is attenuated by the partition 203.

According to the present embodiment, since the radiation noise propagated to the low-frequency circuit 103 side in the space inside the housing 100 is attenuated, leakage of radio frequency noise from the opening of the low-frequency connector 105 to the outside of housing 100 can be suppressed. That is, the fixing holes 208 (including the fixing holes 206 and 207) arranged so as to satisfy the condition of $\lambda/4 > L$ constitutes the function as a suppressing unit together with the partition wall 203.

Note that in the present embodiment, for example, in FIG. 3 and elsewhere, the metal base 201 has cutouts for avoiding the low-frequency connector 105 and the radio-frequency connector 106 at positions corresponding to the low-frequency connector 105 and the radio-frequency connector 106 after the housing 100 is assembled. However, the illustration is omitted for simplicity of explanation.

Effects of the present embodiment configured as described above will be described.

In an electronic control device for an automobile, it is necessary to mount a semiconductor device of a high operating frequency (radio-frequency circuit), along with an increase in the required computing performance. Therefore, it is necessary to place a radio-frequency circuit and a semiconductor device of a low operating frequency (low-frequency circuit) on one board. Along with this, it is necessary to provide the electronic control device with a low-frequency connector and a radio-frequency connector for connecting to an external device. However, a low-frequency connector is larger in size than a radio-frequency connector because it is used for inputting not only communication signals such as CAN but also power and ground, and is often made of resin. Therefore, there is concern about leakage of radiation noise from the radio-frequency circuit to the outside of the electronic control device through the low-frequency connector.

On the other hand, in the present embodiment, the electronic control device is configured to include the printed circuit board 101 on which the radio-frequency circuit 104 (radio-frequency electronic component) at least part of which is driven at a radio frequency and the low-frequency circuit 103 (low-frequency electronic component) driven at a low frequency are mounted, the housing 100 made of metal that includes therein the printed circuit board 101 together with the radio-frequency circuit 104 and the low-frequency circuit 103, a plurality of (for example, six) radio-frequency connectors 106a to 106f arranged so as to extend from the printed circuit board 101 through the housing 100 to the outside of the housing 100 and used for transmitting and receiving signals related to the radio-frequency circuit 104 mounted on the printed circuit board 101 to and from the outside of the housing, the low-frequency connector 105 arranged so as to extend from the printed circuit board 101 through the housing 100 to the outside of the housing 100 and used for transmitting and receiving signals related to the low-frequency circuit 103 mounted on the printed circuit board 101 to and from the outside of the housing, and the partition wall 203 that suppress propagation of the radiation noise to the low-frequency connector 105 radiated by the driving of the radio-frequency circuit 104. Therefore, it is possible to suppress leakage of radio-frequency radiation noise, radiated from a noise source, to the outside.

<Modification 1 of First Embodiment> A modification of the first embodiment of the present invention will be described with reference to FIGS. 4 and 5. In the present modification, only the differences from the first embodiment will be described. In the drawings used in the present modification, the same members as those in the first embodiment are denoted by the same reference numerals, and the description thereof will be omitted.

In the present modification, the metal cover 202 and the partition wall 203 are AC-coupled via the printed circuit board 101.

Figure 4:
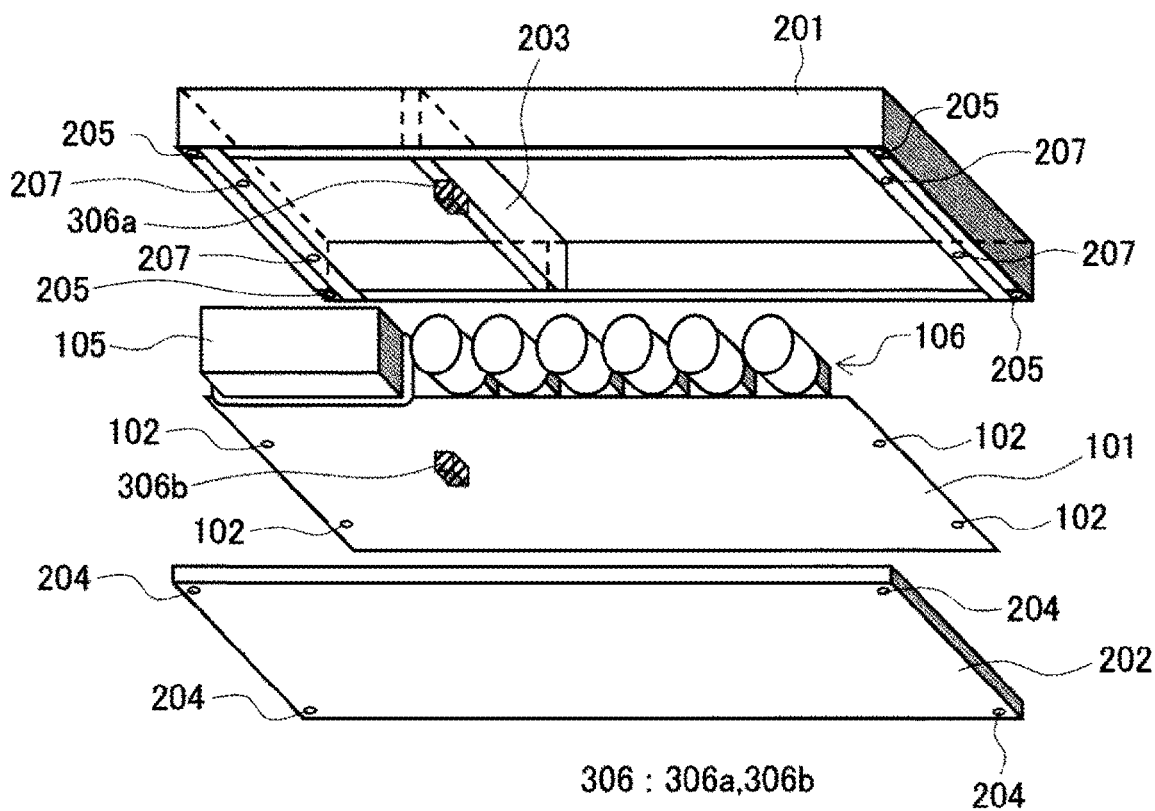
FIG. 4 is an exploded view of an electronic control device according to Modification 1 of the first embodiment.
Figure 5:
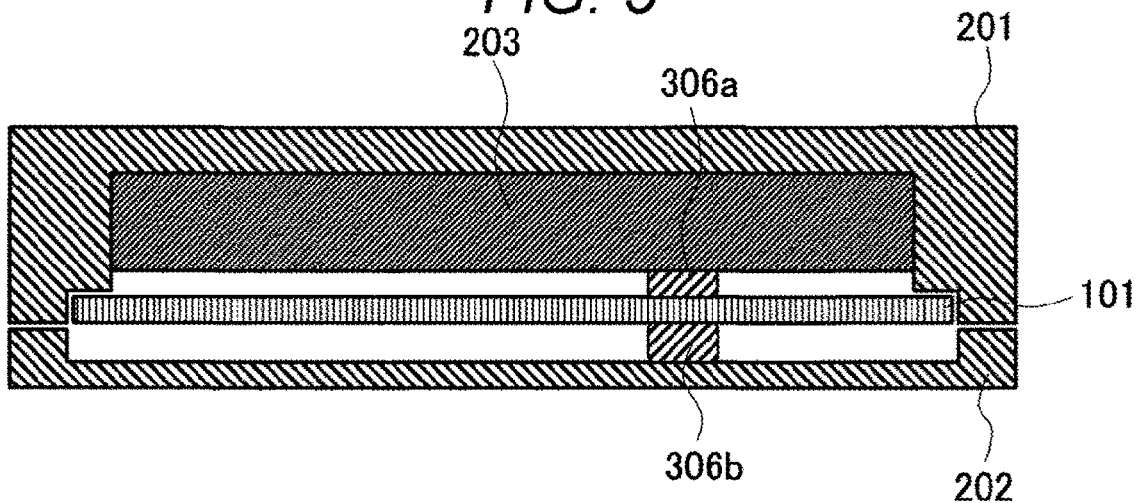
FIG. 5 is a cross-sectional view at a position of a partition wall of the electronic control device according to Modification 1 of the first embodiment.

FIG. 4 is an exploded view of an electronic control device according to the present modification, and FIG. 5 is a cross-sectional view at the position of the partition wall.

In FIGS. 4 and 5, at least one dielectric material 306a is disposed below the partition wall 203 at a position corresponding to a position between the low-frequency circuit 103 and the radio-frequency circuit 104 of the printed circuit board 101. Also, a dielectric material 306b is disposed between the lower surface of the printed circuit board 101 and the metal cover 202 at a position corresponding to the dielectric material 306a. With such a configuration, the metal cover 202, the partition wall 203, and the printed circuit board 101 are AC-coupled via the dielectric materials 306a and 306b.

The other configurations are the same as those in the first embodiment.

Even in the present modification configured as described above, the same effects as those of the first embodiment can be obtained.

Further, even when the metal cover 202 and the partition wall 203 cannot be DC-coupled via the printed circuit board 101, that is, even when the fixing hole 208 cannot be provided in the printed circuit board 101, it is possible to suppress leakage of radio-frequency radiation noise, radiated from the noise source, to the outside.

<Modification 2 of First Embodiment> Another modification of the first embodiment of the present invention will be described with reference to FIG. 6. In the present modification, only the differences from the first embodiment will be described. In the drawings used in the present modification, the same members as those in the first embodiment are denoted by the same reference numerals, and the description thereof will be omitted.

In the present modification, a plurality of fixing holes are provided along the partition wall.

Figure 6:
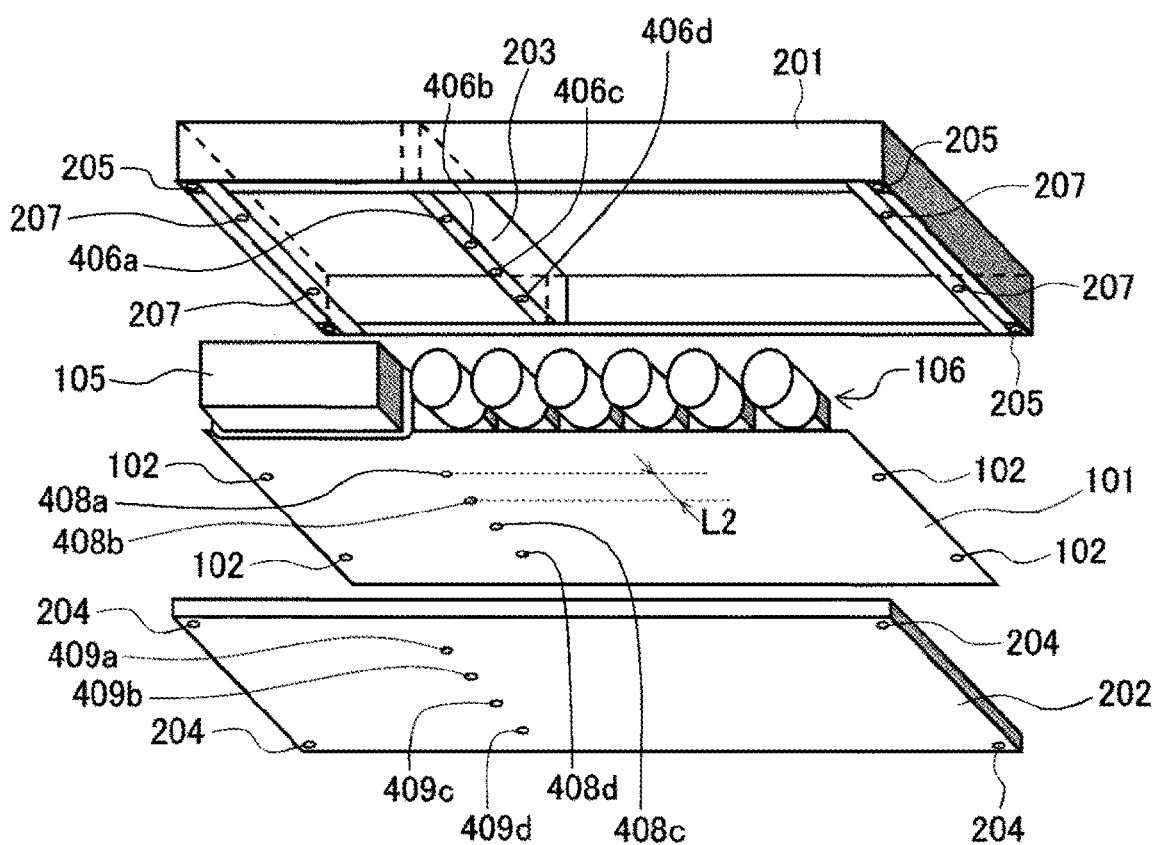
FIG. 6 is an exploded view of an electronic control device according to Modification 2 of the first embodiment.

FIG. 6 is an exploded view of an electronic control device according to the present modification.

In FIG. 6, a plurality of (for example, four) fixing holes (screw holes) 406a to 406d are provided below the partition wall 203 along the partition wall 203.

Between the low-frequency circuit 103 and the radio-frequency circuit 104 of the printed circuit board 101, the fixing holes (screw holes) 408a to 408d are provided at positions corresponding to the fixing holes 406a to 406d of the partition wall 203, respectively. Also, the metal cover 202 is provided with fixing holes (screw holes) 409a to 409d at positions corresponding to the fixing holes 406 and 408, respectively. The fixing holes 409a to 409d of the metal cover 202 and the fixing holes 406a to 406d of the partition wall 203 are fixed to each other with metal screws via the fixing holes 408a to 408d of the printed circuit board 101, so that the metal base 201 and the metal cover 202 and the frame ground of the printed circuit board 101 are DC-coupled to have the same potential.

Here, in a portion where the space in which the radio-frequency circuit 104 is disposed and the space in which the low-frequency circuit 103 is disposed communicate with each other inside the housing 100, that is, in the clearance between the partition wall 203 and the printed circuit board 101, a relationship between a distance L2 and a wavelength $\lambda$ satisfies $\lambda/4 > L2$, where the distance L2 represents the distance of the longest part in the cross section taken along a plane along the partition wall 203, that is, the distance between the fixing holes 408a to 408d and the distance between the fixing hole 408 and the inner surface of the metal cover 202 in the outer peripheral direction, and the wavelength $\lambda$ represents the wavelength of the radiation noise due to the driving of the radio-frequency circuit 104.

The other configurations are the same as those in the first embodiment.

Even in the present modification configured as described above, the same effects as those of the first embodiment can be obtained.

Further, even if the outer size of the printed circuit board 101 becomes large with respect to the wavelength of the radiation noise (radio-frequency noise), by adjusting the number of fixing holes (screw holes) and the positional relationship (that is, the setting of the distance L2), it is possible to suppress leakage of radio-frequency radiation noise radiated from the noise source to the outside.

<Modification 3 of First Embodiment> Still another modification of the first embodiment of the present invention will be described with reference to FIGS. 7 and 8. In the present modification, only the differences from the first embodiment will be described. In the drawings used in the present modification, the same members as those in the first embodiment are denoted by the same reference numerals, and the description thereof will be omitted.

In the present modification, a cutout portion is provided at a position corresponding to the partition wall of the printed circuit board, and a protrusion is provided at a position corresponding to the cutout portion of the metal base.

Figure 7:
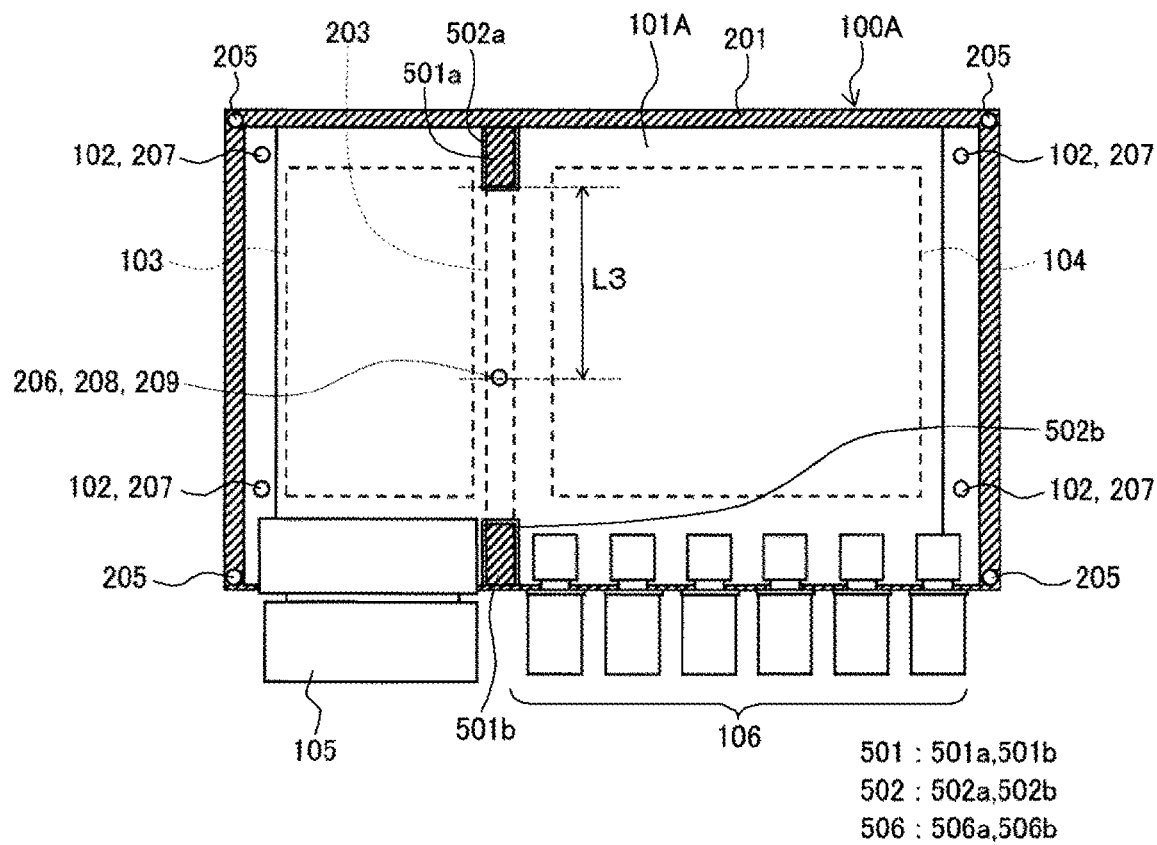
FIG. 7 is a cross-sectional view taken along a plane along an upper surface of a board of an electronic control device according to Modification 3 of the first embodiment.
Figure 8:
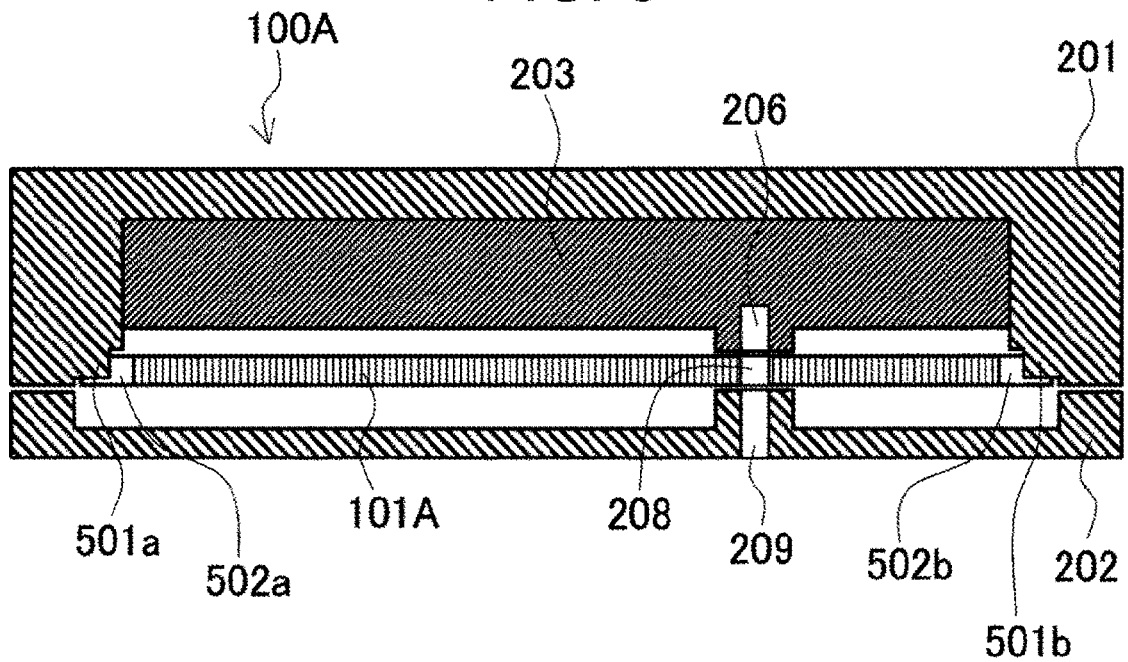
FIG. 8 is a cross-sectional view at a position of a partition wall of the electronic control device according to Modification 3 of the first embodiment.

FIG. 7 is a cross-sectional view taken along a plane along the upper surface of the board of the electronic control device according to the present modification, and FIG. 8 is a cross-sectional view at the position of the partition wall.

In FIGS. 7 and 8, a printed circuit board 101A has cutouts 502a and 502b at positions corresponding to the partition wall 203. Further, the metal base 201 has protrusions 501a and 501b at positions corresponding to the cutouts 502a and 502b of the printed circuit board 101A, respectively. Note that, in FIG. 7, the position corresponding to the partition wall 203 is indicated by broken lines. The protrusions 501*a* and 501*b* of the metal base 201 are formed to be protruded along the cutouts 502*a* and 502*b* so as not to be in contact with the printed circuit board 101A, in a direction from the outer periphery of the metal base 201 to the printed circuit board 101A at the positions of the cutouts 502*a* and 502*b* of the printed circuit board 101A. In other words, it can be said that the protrusions 501*a* and 501*b* of the metal base 201 are formed to have a downward protruding shape, with respect to the partition wall 203 disposed with a clearance with respect to the upper surface of the printed circuit board 101A, from the lower surface thereof up to a position of the lower surface of the printed circuit board 101A.

Here, in a portion where the space in which the radio-frequency circuit 104 is disposed and the space in which the low-frequency circuit 103 is disposed communicate with each other inside the housing 100, that is, in the clearance between the partition wall 203 and the printed circuit board 101A, a relationship between a distance L3 and a wavelength $\lambda$ satisfies $\lambda/4 > L3$, where the distance L3 represents the distance of the longest part in the cross section taken along a plane along the partition wall 203, that is, the distance between the fixing hole 208 and the inner surface of the metal base 201 in the outer peripheral direction (here, protrusions 501*a* and 501*b*), and the wavelength $\lambda$ represents the wavelength of the radiation noise due to the driving of the radio-frequency circuit 104.

The other configurations are the same as those in the first embodiment.

Even in the present modification configured as described above, the same effects as those of the first embodiment can be obtained.

Moreover, even if the external size of the printed circuit board 101A becomes large with respect to the wavelength of the radiation noise (radio-frequency noise), since the printed circuit board 101A is provided with the cutouts 502*a* and 502*b* and the metal base 201 is provided with the protrusions 501*a* and 501*b* so that the distance between the fixing hole 208 and the inner surface in the outer circumferential direction of the metal base 201 (here, the protrusions 501*a* and 501*b*) can be adjusted to be short, it is possible to suppress leakage of the radio-frequency radiation noise, radiated from the noise source, to the outside.

<Supplementary Note>

It should be noted that the present invention is not limited to the above-described embodiments, and various modifications and combinations are included within the scope of the invention. Further, the present invention is not limited to one provided with all of the configurations described in the above-described embodiments, and includes one in which some of the configurations are deleted.

REFERENCE SIGNS LIST 1 electronic control device
100 housing
101, 101A printed circuit board
102 fixing hole (screw hole)
103 low-frequency circuit
104 radio-frequency circuit
105 low-frequency connector
106 (106*a* to 106*f*) radio-frequency connector
201 metal base
202 metal cover
203 partition wall
204 to 209 fixing hole (screw hole)
306*a*, 306*b* dielectric material
406 (406*a* to 406*d*) fixing hole (screw hole)
408 (408*a* to 408*d*) fixing hole (screw hole)
409 (409*a* to 409*d*) fixing hole (screw hole)
501*a*, 501*b* protrusion
502*a*, 502*b* cutout

The invention claimed is:

1. An electronic control device comprising:
a board on which a radio-frequency electronic component that operates at a predetermined frequency or higher is mounted;
a housing made of metal, the housing internally including the board;
a high-speed communication connector for connecting to outside, the high-speed communication connector being mounted on the board; and
a low-speed communication connector for connecting to the outside, the low-speed communication connector being mounted on the board and having a communication speed lower than the communication speed of the high-speed communication connector,
wherein the housing includes a partition wall provided between the radio-frequency electronic component and the low-speed communication connector.

2. The electronic control device according to claim 1, wherein
a low-frequency electronic component that operates at a frequency lower than a predetermined frequency is mounted on the board,
the low-frequency electronic component and the radio-frequency electronic component are mounted on the board in such a manner that the board is divided into a low-frequency region in which the low-frequency electronic component is mounted and a radio-frequency region in which the radio-frequency electronic component is mounted, and
the partition wall is provided between the low-frequency region and the radio-frequency region.

3. The electronic control device according to claim 2, wherein
the housing includes a metal base and a metal cover, and
the partition wall is electrically DC-coupled to the metal base and the metal cover.

4. The electronic control device according to claim 3, wherein
the partition wall is formed integrally with the metal base,
the partition wall and the metal cover are connected to each other with a metal screw, and
a screw hole for allowing the metal screw to pass through is formed in the board.

5. The electronic control device according to claim 4, wherein
$\lambda/4 > L$ is satisfied, where L represents, among distances from the screw hole to side surfaces of the housing, a longer distance of distances along the partition wall, and $\lambda$ represents a wavelength of radiation noise radiated by driving of the radio-frequency electronic component.

6. The electronic control device according to claim 5, wherein
the board includes a signal ground and a frame ground, and
the screw hole is a screw hole formed in the frame ground.

7. The electronic control device according to claim 4, wherein
the partition wall and the metal cover are connected to each other with a plurality of metal screws, and a plurality of screw holes for allowing the plurality of the metal screws to pass through are formed in the board.

8. The electronic control device according to claim 7, wherein
$\lambda/4 > L2$ is satisfied, where L2 represents an interval between the screw holes, and $\lambda$ represents a wavelength of radiation noise radiated by driving of the radio-frequency electronic component.

9. The electronic control device according to claim 2, wherein
the housing includes a metal base and a metal cover, and
the partition wall is electrically AC-coupled to the metal base and the metal cover.

10. The electronic control device according to claim 9, further comprising:
a first dielectric material provided between the partition wall and the board; and
a second dielectric material provided between the board and the metal cover.

* * * * *